United States Patent [19]

Izumi et al.

[11] 4,118,785
[45] * Oct. 3, 1978

[54] METHOD AND APPARATUS FOR DIGITAL ATTENUATION BY PATTERN SHIFTING

[75] Inventors: Kazuto Izumi; Kazuo Izumi, both of Yokohama, Japan

[73] Assignee: Nippon Telegraph and Telephone Public Corporation, Tokyo, Japan

[ * ] Notice: The portion of the term of this patent subsequent to Jan. 18, 1994, has been disclaimed.

[21] Appl. No.: 701,574

[22] Filed: Jul. 1, 1976

Related U.S. Application Data

[63] Continuation of Ser. No. 507,812, Sep. 20, 1974, Pat. No. 4,004,140.

[30] Foreign Application Priority Data

Oct. 8, 1973 [JP] Japan ................ 48-113109

[51] Int. Cl.$^2$ .................................... G06F 7/39
[52] U.S. Cl. .................... 364/754; 364/757; 364/761; 364/764
[58] Field of Search ............. 235/152, 154, 156, 164; 179/15 AC; 364/754, 757, 761, 764

[56] References Cited

U.S. PATENT DOCUMENTS

| 3,588,460 | 6/1971 | Smith | 235/156 |
| 3,688,097 | 8/1972 | Montgomery | 235/152 |
| 3,691,359 | 9/1972 | Dell et al. | 235/164 |
| 3,752,970 | 8/1973 | Aaron et al. | 235/152 |
| 3,825,924 | 7/1974 | Montgomery | 235/152 X |
| 4,004,140 | 1/1977 | Izumi et al. | 235/152 |

Primary Examiner—David H. Malzahn
Attorney, Agent, or Firm—Burgess, Ryan and Wayne

[57] ABSTRACT

A digital attenuator is disclosed which is capable of having the output PCM signal attenuated nearly in proportion to the input PCM signal level based upon simple logic operations of $$P_{out} = \alpha P_{in} + N$$

where
$P_{out}$ = output PCM signal
$P_{in}$ = input PCM signal processed by a compressor
$\alpha$ = a real number satisfying the condition $0 < \alpha < 1$, and
$N$ = a real number larger than or equal to 0.

When $N = O$, in order to obtain $P_{out} = \alpha P_{in}$, $P_{in}$ is shifted to the lower digit side by a predetermined number of bits by a single pattern shift cirucit, or $P_{in}$ is branched to the plurality of pattern shift circuits and $P_{in}$ is shifted to the lower digit side by predetermined number of bits respectively, which are different and the output of the pattern shift circuits are added to each other by an adder. When $N > O$, to obtain the sum $\alpha P_{in} + N$, the output signal $\alpha P_{in}$, which is obtained in the manner described above, is added to a specific pattern representing $N$ which is generated by a specific pattern generating circuit. The above sum is compared with $P_{in}$ and when the former is larger than or equal to the latter, $P_{in}$ becomes $P_{out}$, while when the former is less than the latter, the sum is derived as $P_{out}$. Thus, an attenuation nearly proportional to the input FCM signal level may be attained.

1 Claim, 6 Drawing Figures

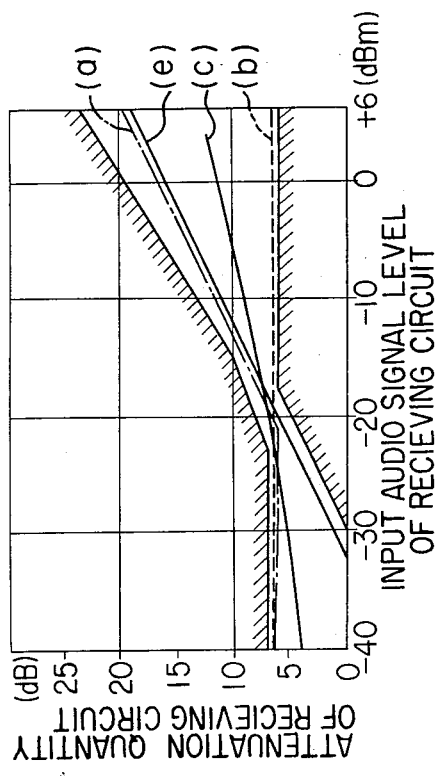

FIG. 2

| SEGMENT NUMBER | INPUT PCM PATTERN A B C | INPUT PCM PATTERN W X Y Z | OUTPUT PCM PATTERN A B C | OUTPUT PCM PATTERN W X Y Z | |
|---|---|---|---|---|---|
| 1 | 0 0 0 | W X Y Z | 0 0 0 | 0 W X Y | |
| 2 | 0 0 1 | W X Y Z | 0 0 0 ADD 0 0 1 | W X Y Z 1 0 0 0 | ($W \neq 1$) |
| | 0 0 1 | 1 X Y Z | 0 0 1 | 1 X Y Z | |
| 3 | 0 1 0 | W X Y Z | 0 0 1 ADD 0 1 0 | 0 0 X Y W X Y Z 1 0 0 | ($W \cdot X \neq 1$) |
| | 0 1 0 | 1 1 Y Z | 0 1 0 | (W+X)1$\overline{X}$ Y Z 0 0 0 Y | |
| 4 | 0 1 1 | W X Y Z | 0 1 0 ADD 0 1 1 | W X Y Z 1 0 W' X' $\overline{Y}$ Z | $\begin{pmatrix} W \cdot X \cdot Y \neq 1 \\ W' = W + X \cdot Y \\ X' = \overline{X} \cdot Y + \overline{Y} \cdot X \end{pmatrix}$ |
| | 0 1 1 | 1 1 1 Z | 0 1 1 | 0 0 0 0 | |
| 5 | 1 0 0 | W X Y Z | 0 1 1 ADD 1 0 0 | W X Y Z W*X*Y*$\overline{Z}$ | $\begin{pmatrix} W \cdot X \cdot Y \cdot Z \neq 1 \\ W^* = W + X \cdot Y \\ X^* = X(\overline{Z} + \overline{Y}) + \overline{X} \cdot Y \cdot Z \\ Y = \overline{Z} Y + Z \overline{Y} \end{pmatrix} |
| | 1 0 0 | 1 1 1 Z | 1 0 0 | 0 0 0 0 | |
| 6 | 1 0 1 | W X Y Z | 1 0 0 | W X Y Z | |
| 7 | 1 1 0 | W X Y Z | 1 0 1 | W X Y Z | |
| 8 | 1 1 1 | W X Y Z | 1 1 0 | W X Y Z | |

REMARK: X·Y IS THE LOGICAL PRODUCT OF X AND Y.
X+Y IS THE LOGICAL SUM OF X AND Y.

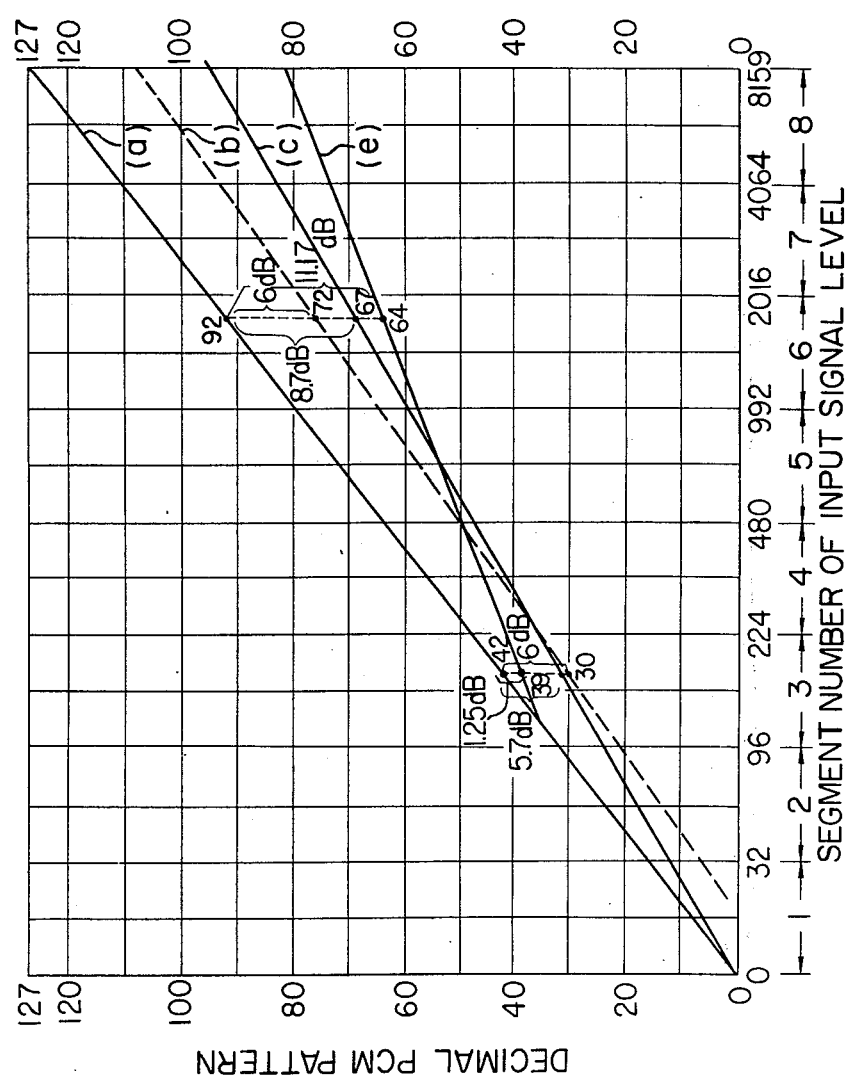

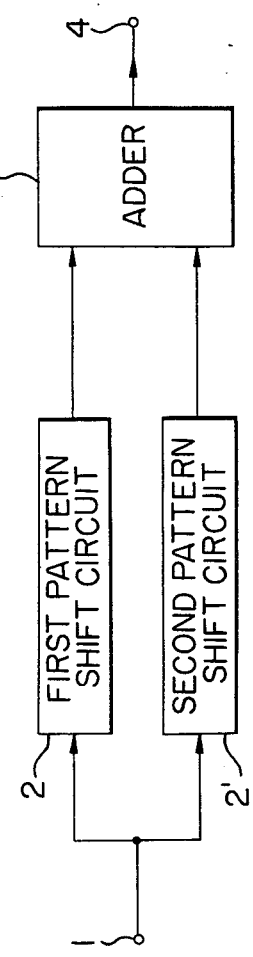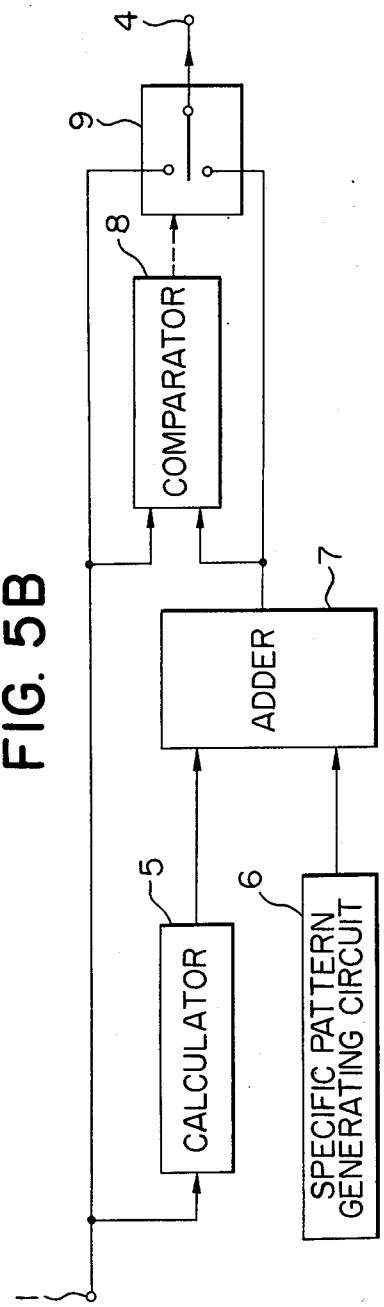
FIG. 5A
FIG. 5B

METHOD AND APPARATUS FOR DIGITAL ATTENUATION BY PATTERN SHIFTING

This is a continuation, of application Ser. No. 507,812, filed Sept. 20, 1974, now U.S. Pat. No. 4,004,140. Priority of above application is claimed under 35 USC 119 based on Japanese Application No. 113109/1973, filed Oct. 8, 1973. A certified copy of which is of record in the file of the parent application.

BACKGROUND OF THE INVENTION

This invention relates to a digital attenuator which is inserted into a circuit on the receiving side of a digital echo suppressor so that attenuation nearly in proportion to the input PCM signal level may be attained.

In order to improve the echo attenuation effect, in conventional analogue echo suppressors, an analogue attenuator having the attenuation quantity of about 6 dB is inserted into a receiving circuit so that echo may be attenuated by an amount corresponding to the attenuation attained by this attenuator when the transmitting signal is higher than the receiving signal. In order to improve further the echo suppression effect, the analogue attenuator of the type described above is combined with the analogue amplitude compressor so that the echo attenuation quantity may be nearly proportional to the input audio signal level.

Upon the introduction of PCM communications systems, there have been proposed digital echo suppressors capable of suppressing echo without modifying or converting the PCM signal to an analogue signal. In general the conventional digital echo suppressors used the digital attenuator in order to attenuate the PCM signal companded by about 6dB by the piecewise linear compander as with the case of the conventional analogue attenuator.

However, conventional digital attenuators have the defects that the circuit arrangement is very complex because the complex logic operations must be carried out and that the attenuation quantity is constant without the input audio signal level. Therefore in order to attain an attenuation nearly in proportion to the input audio level, the conventional digital attenuator must be used in combination with the digital compressor whose function is similar to that of the analogue compressor. As a result, the circuit arrangement becomes more and more complex.

SUMMARY OF THE INVENTION

One of the objects of this invention is therefore to provide a digital attenuator which may attain the attenuation quantity nearly in proportion to the input PCM signal level by using the simple logic operations.

Another object of this invention is to provide a digital attenuator of simple construction.

Briefly stated, in order to accomplish the above and other objects of this invention, the simple logic operations are carried out by utilizing the non-linearity of the input signal which is the PCM signal coded in a PCM terminal equipment so as to have the compression characteristics, whereby the attenuation may be attained nearly in proportion to the input signal. The logic operations of this invention is divided into two categories depending upon whether a specific pattern N exists or not. When the specific pattern $N = 0$, the output PCM signal $P_{out}$ is derived from the operation of the product of $\alpha$ and $P_{in}$. More particularly, $\alpha P_{in}$ is obtained by shifting $P_{in}$ to the lower digit side by a predetermined number of bits by a single pattern shift circuit, or shifting $P_{in}$ to the lower digit side by a predetermined number of bits which are different from each other in a plurality of pattern shift circuits, and adding the outputs of the pattern shift circuits to each other by an adder. When the specific pattern N is larger than zero, the output $\alpha P_{in}$ obtained in the manner described above is added to a specific pattern N which is generated by a specific pattern generating circuit and the sum of $\alpha P_{in}$ and N is compared in a comparator with $P_{in}$. When the sum is larger than or equal to $P_{in}$, a switching circuit is so controlled as to pass the latter to an output terminal as $P_{out}$, but when the sum is less than $P_{in}$, the former is passed through the switching circuit to the output terminal. Thus, the attenuation nearly in proportion to the input PCM signal level may be attained.

The circuit arrangement is varied depending upon the value of $\alpha$. However, it should be noted that the circuit arrangement becomes very simple when $\alpha$ is a reciprocal of $n$th power of 2, such as $\frac{1}{2}$, $\frac{1}{4}$, $\frac{1}{8}$ and so on or the sum thereof such as $\alpha = \frac{1}{2} + \frac{1}{8}$ or $\frac{1}{2} + \frac{1}{4} + \frac{1}{8}$ and so on.

The other objects, features and advantages of this invention will become more apparent from the following description of the preferred embodiments thereof taken in conjunction with the accompanying drawing.

BRIEF DESCRIPTION OF THE DRAWING

FIG. 1 is a table showing the relation between the PCM patterns and audio signal levels obtained by a 15 segment piecewise linear compander;

FIG. 2 is a conversion table used for the conversion of the input PCM patterns into the output PCM patterns by a conventional digital attenuator;

FIGS. 3 (c), (e) is a graph illustrating the relation between the input audio signal level and the decimal PCM pattern obtained by a digital attenuator of this invention;

FIGS. 4 (c), (e) is a graph illustrating the relation between the input audio signal level and the attenuation; and FIGS. 5(a) and 5(b) are block diagrams of a first and second embodiments of this invention.

DESCRIPTION OF THE PREFERRED EMBODIMENTS

FIG. 1 shows the relation between the PCM patterns and the audio signal levels of the positive segments of 15 segment piecewise linear compander which is recommended by CCITT (International Telegraph and Telephone Consultative Committee) and is generally used as a PCM terminal equipment. In practice, the 15 segment piecewise linear compander is consisted of 7 negative segment and 8 positive segments shown in FIG. 1 and the positive and negative segments are symmetrical. W,X,Y, and Z shown in FIG. 1 represent "1" or "0" respectively.

FIG. 2 is a conversion table between input and output PCM patterns of a conventional digital attenuator with attenuation quantity of 6 dB which is disclosed in the paper "6 decibel digital attenuation", by W. L. Montgomery, in Conf. Rec., 1970, IEEE Int. Conf. Communications, pp 7-20 - 7-26. By using this conversion table, some examples of the conventional conversion will be described hereinafter.

(1) When the input PCM pattern belongs to, for instance, Segment No. 6, the output PCM pattern may be derived only by changing the bits in tha columns A, B, and C. For instance when the input PCM pattern is $$\underset{(1\ 0\ 1\ 1\ 1\ 0\ 0)_2}{A\ B\ C\ W\ X\ Y\ Z}$$

the output PCM pattern becomes $$\underset{(1\ 0\ 0\ 1\ 1\ 0\ 0)_2}{A\ B\ C\ W\ X\ Y\ Z}$$

To obtain the attenuation quantity, the input and output PCM patterns are converted into the audio signal levels from the conversion table shown in FIG. 1. That is, the input PCM pattern (1 0 1 1 1 0 0)$_2$ is converted into the audio signal level (0 0 1 1 1 0 0 0 1 1 1 1)$_2$ − 32 = 1791 while the output PCM pattern (1 0 0 1 1 0 0)$_2$ is converted into (0 0 0 1 1 1 0 0 0 1 1 1)$_2$ − 32 = 879.

Therefore, the attenuation quantity is given by 20 log 1791/879 = 6.18 dB.

(2) When an input PCM pattern belongs to, for instance, Segment No. 3, the conversion method is different from that of Example (1). That is, when W·X ≠ 1, the bits in the columns A,B, and C must be changed to (0 0 1)$_2$ and then (1 0 0)$_2$ must be added. However, when W·X = 1, the bits in the columns A,B, and C remain unchanged while the bits in the columns W,X,Y, and Z must be changed shown in segment 3 in FIG. 2. For instance when an input PCM pattern is $$\underset{(0\ 1\ 0\ 1\ 0\ 1\ 0)_2}{A\ B\ C\ W\ X\ Y\ Z}.$$

Hence,

W·X = 0 so that $$\underset{(0\ 1\ 0)}{A\ B\ C}$$

is changed to $$\underset{(0\ 0\ 1)}{A\ B\ C}.$$

Next the addition $$\underset{(0\ 0\ 1\ 1\ 0\ 1\ 0)_2}{A\ B\ C\ W\ X\ Y\ Z} + (1\ 0\ 0)_2$$

is carried out to obtain the output PCM pattern (0 0 1 1 1 1 0)$_2$.

To obtain the attenuation quantity, both the input and output PCM patterns are converted into the audio signal levels by the conversion table shown in FIG. 1. That is, the input PCM pattern (0 1 0 1 0 1 0)$_2$ is converted into (0 0 0 0 0 1 1 0 1 0 0 1 1)$_2$ − 32 = 179 while the output PCM pattern (0 0 1 1 1 1 0)$_2$ is converted into (0 0 0 0 0 0 1 1 1 1 1 0 0 1)$_2$ − 32 = 89

Therefore, the attenuation is given by 20 log 179/89 = 6.07 dB.

As described above, the conventional digital attenuator described above may attain the attenuation quantity of about 6 dB irrespective of the input levels as indicated by the curves (b) in FIGS. 3 and 4, respectively.

As mentioned above, the different operations must be excuted in the conventional digital attenuator depending upon the segment numbers, so that the arrangement of logic circuits becomes very complex. Moreover, the attenuation quantity is constant irrespective of the input level, so that the echo compression effect is not satisfactory in practice. Therefore, the conventional digital attenuator must be used in combination with a digital compressor or the like. But at present such combinations are not disclosed in the literature, papers and patents.

In view of the above, one of the objects of this invention is to provide a digital attenuator simple in construction and capable of attaining the desired characteristic that the attenuation quantity is in proportion to the input level.

First the underlying principle of this invention will be described hereinafter. For the sake of explanation, a decimal number designated by P is referred to as "a decimal PCM pattern", and this is a converted PCM pattern of a PCM pattern in binary code shown in FIG. 1.

The attenuation nearly in proportion to input may be attained based upon the following equation:

$$P_{out} = \alpha P_{in} + N \qquad (1)$$

where
- $P_{in}$ = input decimal PCM pattern,
- $P_{out}$ = output decimal PCM pattern, and
- $\alpha$ = a real number satisfying the condition $0 < \alpha < 1$, and
- $N$ = a real number larger than or equal to 0.

In Eq. (1), when $\alpha P_{in} + N < P_{in}$, $\alpha P_{in} + N$ is derived as the output, and the attenuation varies depending upon the input level. But when $\alpha P_{in} + N \geq P_{in}$, $P_{in}$ is derived as the output, and no attenuation is obtained.

This invention will become apparent from the description of some examples of the operations required to attain the desired attenuation and of the circuits for carrying out these operations.

A. Example 1. Calculation of the attenuation quantity.

This is a example of the case N = 0. Assume that $$\alpha = \tfrac{1}{2} + \tfrac{1}{4} = 0.75.$$

Then, from Eq. (1), $$P_{out} = 0.75\, P_{in} \qquad (2)$$

By using the input PCM patterns used for the explanation of the conventional digital attenuator, the manner of the conversion of the input PCM pattern and the output PCM pattern and the calculation manner of the attenuation quantity will be explained as follows:

(1) When input PCM pattern = $(1\ 0\ 1\ 1\ 1\ 0\ 0)_2$.

In this case, the input PCM pattern is 92 in decimal number so that the output PCM pattern becomes $$P_{out} = 0.75 \times 92 = 69$$

That is, the output PCM pattern is
$(1\ 0\ 0\ 0\ 1\ 0\ 1)_2$ in natural binary code. The corresponding input audio signal level is obtained from FIG. 1 as follows:

$$(0\ 0\ 1\ 1\ 1\ 0\ 0\ 0\ 1\ 1\ 1\ 1\ 1)_2 - 32 = 1791$$

The output PCM pattern is $(1\ 0\ 0\ w\ x\ y\ z)_2$, so that the output audio signal level is obtained also from FIG. 1 as follows:

$$(0\ 0\ 0\ 1\ 0\ 1\ 0\ 1\ 0\ 1\ 1\ 1\ 1)_2 - 32 = 655$$

Therefore, the resulting attenuation quantity is $$20 \log 1791/655 \doteq 8.7 \text{ dB}.$$

(2) When input PCM pattern = $(0\ 1\ 0\ 1\ 0\ 1\ 0)_2$. $P_{in}$ in decimal number is 42 while $P_{out}$ becomes $$0.75 \times 42 = 31 \text{ in decimal number}$$

or
$(0\ 0\ 1\ 1\ 1\ 1\ 1)_2$ in binary number.
From FIG. 1, the corresponding input audio signal level is $$P_{in} = (0\ 0\ 0\ 0\ 0\ 1\ 1\ 0\ 1\ 0\ 0\ 1\ 1)_2 - 32 = 179$$

The output audio signal level is $$P_{out} = (0\ 0\ 0\ 0\ 0\ 0\ 1\ 1\ 1\ 1\ 1\ 0\ 1)_2 - 32 = 93$$

Therefore, the attenuation quantity is $$20 \log 179/93 = 5.7 \text{ dB}.$$

The relation between the above input and output PCM patterns is indicated by the curve $c$ in FIG. 3.

B. Example 2. Calculation of the attenuation quantity.

This is the example of the case $N > 0$. Assume that $N = 18$, and
$\alpha = \frac{1}{2} = 0.5$.
From Eq. (1), $$P_{out} = 0.5\ P_{in} + 18 \qquad (3)$$

The attenuation attained by Eq. (2) will be described with the use of the tables shown in FIG. 1 and FIG. 2 as with the case of Example 1.

(1) When input PCM pattern = $(1\ 0\ 1\ 1\ 1\ 0)_2$. In this case, $P_{in}$ in decimal number is 92 so that $P_{out}$ becomes $$P_{out} = 0.5 \times 92 + 18 = 64 \text{ in decimal number}$$

or
From FIG. 1, the binary number is $(1\ 0\ 0\ 0\ 0\ 0\ 0)_2$,
Then input audio signal level is $$(0\ 1\ 1\ 1\ 0\ 0\ 0\ 1\ 1\ 1\ 1\ 1\ 1)_2 - 32 = 1791$$

while the output audio signal level is $$(0\ 0\ 0\ 1\ 0\ 0\ 0\ 0\ 0\ 1\ 1\ 1\ 1)_2 - 32 = 495$$

Therefore, the attenuation quantity is $$20 \log 1791/495 = 11.17 \text{ dB}.$$

(2) When input PCM pattern = $(0\ 1\ 0\ 1\ 0\ 1\ 0)_2$

In this case, $P_{in}$ is 42 in decimal number so that $P_{out}$ becomes $$P_{out}\ 0.5 \times 42 + 18 = 39$$

or
$(0\ 1\ 0\ 0\ 1\ 1\ 1)_2$ in binary number.
The input audio signal level is $$P_{in} = (0\ 0\ 0\ 0\ 0\ 1\ 1\ 0\ 1\ 0\ 0\ 1\ 1)_2 - 32 = 179$$

while the output audio signal level is $$P_{out} = (0\ 0\ 0\ 0\ 0\ 1\ 0\ 1\ 1\ 1\ 0\ 1\ 1)_2 - 32 = 155$$

Therefore, the attenuation quantity is $$20 \log 179/155 \doteq 1.25 \text{ dB}.$$

As described above, when the input level drops from 92 to 42, the attenuation drops from 11.17 dB to 1.25 dB.

The relation between the above described decimal PCM input and output patterns is indicated by the curve (e) in FIG. 3. That is, as the input audio level is increased, the decimal PCM input pattern FIG. 3(a) is also linearly increased. However, when the decimal input level is higher than $N/(1-\alpha)$, the attenuation quantity decimal PCM output pattern FIG. 3(e) increases as the input level rises, that is known from the spreading spacing between the curves (a) and (e). If the attenuation is obtained according to Eq. (3) when the input level is less than 36, the output level would become higher than the input level. To overcome this problem, the output level is made equal to the input level, so that the curves (a) and (e) are superposed upon each other in the region less than 36 of input level.

FIG. 4 shows the attenuation quantity attained by a digital attenuator of this invention with the input audio signal level 5727 being defined as 0 dBm. The hatched portions are the ranges of the attenuation quantity inserted in a receiver circuit of an echo suppressor which is recommended by recommendation G. 161 from CCITT. According to this invention, the characteristic curves (c) and (e) are obtained. It is readily seen that when the input audio signal level is high, the larger attenuation quantity is attained. The slopes of the curves (c) and (e) may be varied by varying the constant $\alpha$ in Eq. (1) while the flexion point to the curve (e) may be suitably selected by selecting a suitable value N in Eq. (1). The characteristic curves (c) and (e) obtained by this invention would be only attainable by the combination of a conventional attenuator of a constant attenuation quantity and a compressors, so that it is readily seen that the echo suppression effect of this invention is considerably greater than those attained by the conventional analogue and digital attenuators. A further important feature of this invention is that the circuits for attaining such proportional attenuation characteristic curves may be obtained in a relatively simple manner.

C. First Embodiment of Digital Attenuator:

In order to attain the digital attenuation described hereinbefore in conjunction with Example A, in which $N = 0$ and $\alpha = \frac{1}{2} + \frac{1}{4} = 0.75$, a digital attenuator of this invention shown in block diagram in FIG. 5(a) comprises, in general, an input terminal 1, a first pattern shift circuit 2, a second pattern shift circuit 2', an adder 3, and an output terminal 4. The input PCM pattern applied to the input terminal 1 is applied to both the first and second pattern shift circuits 2 and 2', and the output patterns thereof which have been shifted in each pattern shift circuit are added to the adder 3, so that the output PCM pattern is derived from the output terminal 4 as will be described in detail in the following examples.

(1) When the input PCM pattern = $(1\ 0\ 1\ 1\ 1\ 0\ 0)_2$.

In the first pattern shift circuit 2, the input PCM pattern is shifted by one bit such as $(0\ 1\ 0\ 1\ 1\ 1\ 0)_2$ while in the second pattern shift circuit 2', it is shifted by two bits such as $(0\ 0\ 1\ 0\ 1\ 1\ 1)_2$. The outputs of the pattern shift circuits 2 and 2' are added to each other by the adder 3, so that the output PCM pattern $(1\ 0\ 0\ 0\ 1\ 0\ 1)_2$ may be derived from the output terminal 4.

(2) When the input PCM pattern = $(0\ 1\ 0\ 1\ 0\ 1\ 0)_2$:

In the first shift circuit 2, the input PCM pattern $(0\ 1\ 0\ 1\ 0\ 1\ 0)_2$ is shifted by one bit such as $(0\ 0\ 1\ 0\ 1\ 0\ 1)_2$ while in the second pattern shift circuit 2', it is shifted by two bits such as $(0\ 0\ 0\ 1\ 0\ 1\ 0)_2$. The outputs of the first and second pattern shift circuits 2 and 2' are added by the adder 3, so that the output PCM pattern $(0\ 0\ 1\ 1\ 1\ 1\ 1)_2$ is derived from the output terminal 4.

In summary, the operation of $0.75 \times P_{in}$ in Eq. (2) is executed by the first and second pattern shift circuits 2 and 2' and the adder 3 to give the output PCM pattern.

D. Second Embodiment of Digital Attenuator:

The second embodiment of this invention shown in block diagram in FIG. 5(b) is adapted to execute the operation when $N = 18$ and $\alpha = \frac{1}{2} = 0.5$. The digital attenuator comprises, in general, an input terminal 1, an calculator 5, a specific pattern generating circuit 6 an adder 7, a comparator 8, a switching circuit 9 and an output terminal 4. The input PCM pattern $P_{in}$ applied to the input terminal 1 is converted by the calculator 5 into a pattern representing the product of the input PCM pattern $P_{in}$ and the constant $\alpha$. Thereafter, the output pattern of the calculator 5, is added to the adder 7 with specific pattern N generated by the specific pattern generating circuit 6. The calculator 5 is substantially similar in construction to the first embodiment shown in FIG. 5(a) and adapted to produce also the product of $P_{in}$ and the constant $\alpha$.

The output $(\alpha P_{in} + N)$ of the adder 7 is compared with the input PCM pattern $P_{in}$ in the comparator 8 and when the former is greater than or equal to the latter, the latter is transmitted as the output PCM pattern $P_{out}$ to the output terminal 4 through the switching circuit 9 while the former is less than the latter, the former is transmitted through the switching circuit 9 to the output terminal 4 as the output PCM pattern as will be described in detail hereinafter.

(1) For example when input PCM pattern = $(1\ 0\ 1\ 1\ 1\ 0\ 0)_2$:

The input PCM pattern $P_{in}$ applied to the input terminal 1 is applied to the calculator 5, and to the comparator 8 and the switching circuit 9 simultaneously. In the calculator 5, the input PCM pattern $P_{in}$ is shifted by one bit to the right such as $(0\ 1\ 0\ 1\ 1\ 1\ 0)_2$ which represents $0.5 \times P_{in}$. The specific pattern, which is generated by the specific pattern generating circuit 6, represents 18 in decimal number or $(0\ 0\ 1\ 0\ 0\ 1\ 0)_2$ in binary number. The output pattern of the calculator 5 is added to the output pattern of the specific pattern generating circuit 6 in the adder 7 so that the output pattern $(1\ 0\ 0\ 0\ 0\ 0\ 0)_2$ may be obtained. The output of the adder 7 is compared with the input PCM pattern $P_{in}$ $(1\ 0\ 1\ 1\ 1\ 0\ 0)_2$ in the comparator 8. Since the former is less than the latter, the switching circuit 9 is so controlled as to pass the former or $(1\ 0\ 0\ 0\ 0\ 0\ 0)_2$ to the output terminal 4.

(2) For example, when input PCM pattern = $(0\ 1\ 0\ 1\ 0\ 1\ 0)_2$:

The input PCM pattern $P_{in}$ $(0\ 1\ 0\ 1\ 0\ 1\ 0)_2$ is shifted by the calculator 5 by one bit to the right such as $(0\ 0\ 1\ 0\ 1\ 0\ 1)_2$ which is added to the specific pattern representing $N = 18$ that is, $(0\ 0\ 1\ 0\ 0\ 1\ 0)_2$.

Therefore the sum or the output of the adder 7 is $(0\ 1\ 0\ 0\ 1\ 1\ 1)_2$ which is compared in the comparator 8 with the input PCM pattern $(0\ 1\ 0\ 1\ 0\ 1\ 0)_2$.

Since the former is less than the latter, the former or $(0\ 1\ 0\ 0\ 1\ 1\ 1)_2$ is passed to the output terminal 4 through the switching circuit 9.

(3) For example, when input PCM pattern = $(0\ 0\ 1\ 1\ 1\ 0)_2$:

The output of the calculator 5 is $(0\ 0\ 0\ 1\ 1\ 1\ 1)_2$ and is added to the specific pattern $(0\ 0\ 1\ 0\ 0\ 1\ 0)_2$ so that the sum or the output of the adder 7 becomes $(0\ 1\ 0\ 0\ 0\ 0\ 1)_2$.

This is compared with the input PCM pattern $(0\ 0\ 1\ 1\ 1\ 1\ 0)_2$.

Since the former or $(0\ 1\ 0\ 0\ 0\ 0\ 1)_2$ is greater than the latter, the latter or $(0\ 0\ 1\ 1\ 1\ 1\ 0)_2$ is passed through the switching circuit 9 to the output terminal 4. That is, the input PCM pattern becomes the output PCM pattern without any attenuation.

In summary, when $P_{in} > N/(1-\alpha)$, the input PCM pattern becomes the output PCM pattern without any attenuation, and in this case $P_{in}$ is 36 in decimal number or $(0\ 0\ 1\ 0\ 0\ 1\ 0)_2$ corresponds to the audio signal level attenuated by about 33 dB from the maximum level. Since the audio signal level is very low, there arises no problem in connection with the echo suppression even when the attenuation is zero.

So far the input PCM signal is represented in natural binary code, but it is to be understood that the Gray code or reflected binary code can be used when the PCM pattern of such code is converted into the PCM pattern of natural binary code.

What is claimed is:

1. A digital attenuator comprising a plurality of pattern shift circuits, means for applying an input PCM signal to said plurality of pattern shift circuits for shifting said input PCM signal to the lower digit side, a specific pattern generating circuit for generating an integer pattern, an adder connected to said specific pattern generating circuit and to said pattern shift circuits, a comparator connected to compare the output of said adder with said input PCM signal, and a selector responsive to the output of said comparator for selecting the lower value signal of either of said input PCM signal or the output of said adder.

* * * * *

UNITED STATES PATENT OFFICE
CERTIFICATE OF CORRECTION

Patent No. 4,118,785    Dated October 3, 1978

Inventor(s) Kazuto Izumi, et al

It is certified that error appears in the above-identified patent and that said Letters Patent are hereby corrected as shown below:

In Figure 4, "Recieving" (2 occurrences) should be --Receiving--.

In the Abstract, line 2 from bottom: "FCM" should be --PCM--.

Column 2, line 67: "tha" should be cancelled.

Column 4, line 61: "a" should be --an--.

Column 5, line 26: "20 log 1791/655 $\doteq$ 8.7 dB" should be --20 log 1791/655 = 8.7 dB--.

line 58: "$(101110)_2$" should be --$(1011100)_2$--.

Column 6, line 12: $P_{out}$0.5 x 42 $\doteq$ 18 = 39" should be --$P_{out}$ = 0.5 x 42 + 18 = 39--.

line 25: "20 log 179/155 $\doteq$ 1.25 dB" should be --20 log 179/155 = 1.25 dB--.

Signed and Sealed this

First Day of May 1979

[SEAL]

Attest:

RUTH C. MASON
Attesting Officer

DONALD W. BANNER
Commissioner of Patents and Trademarks